(12) United States Patent
Voiron et al.

(10) Patent No.: US 10,403,710 B2
(45) Date of Patent: Sep. 3, 2019

(54) 3D-CAPACITOR STRUCTURE

(71) Applicant: Murata Integrated Passive Solutions, Caen (FR)

(72) Inventors: Frédéric Voiron, Barraux (FR); Jean-René Tenailleau, Hottot-les-Bagues (FR)

(73) Assignee: Murata Integrated Passive Solutions, Caen (FR)

( * ) Notice: Subject to any disclaimer, the term of this patent is extended or adjusted under 35 U.S.C. 154(b) by 0 days.

(21) Appl. No.: 16/149,353

(22) Filed: Oct. 2, 2018

(65) Prior Publication Data

US 2019/0035880 A1     Jan. 31, 2019

Related U.S. Application Data

(63) Continuation of application No. PCT/EP2017/073451, filed on Sep. 18, 2017.

(30) Foreign Application Priority Data

Sep. 20, 2016 (EP) .................................. 16306200

(51) Int. Cl.
| | | |
|---|---|---|
| H01L 29/94 | (2006.01) | |
| H01L 49/02 | (2006.01) | |
| H01L 27/08 | (2006.01) | |
| H01L 29/06 | (2006.01) | |
| H01G 11/26 | (2013.01) | |

(52) U.S. Cl.
CPC ............. *H01L 28/91* (2013.01); *H01G 11/26* (2013.01); *H01L 27/0805* (2013.01); *H01L 28/90* (2013.01); *H01L 28/92* (2013.01); *H01L 29/0657* (2013.01); *H01L 29/945* (2013.01)

(58) Field of Classification Search
CPC ...... H01L 27/0805; H01L 28/87; H01L 28/91
See application file for complete search history.

(56) References Cited

U.S. PATENT DOCUMENTS

| | | |
|---|---|---|
| 5,077,688 A | 12/1991 | Kumanoya et al. |
| 2006/0202250 A1 | 9/2006 | Hecht et al. |
| 2009/0244808 A1 | 10/2009 | Ohtsuka et al. |
| 2010/0230787 A1 | 9/2010 | Guiraud et al. |
| 2011/0180931 A1 | 7/2011 | Roozeboom et al. |

FOREIGN PATENT DOCUMENTS

| | | |
|---|---|---|
| JP | H03-124059 A | 5/1991 |
| JP | 2009-246180 A | 10/2009 |

OTHER PUBLICATIONS

International Search Report issued for PCT/EP2017/073451, dated Dec. 13, 2017.
Written Opinion of the International Searching Authority issued for PCT/EP2017/073451, dated Dec. 13, 2017.

*Primary Examiner* — Thomas L Dickey
(74) *Attorney, Agent, or Firm* — Arent Fox LLP

(57) ABSTRACT

A 3D-capacitor structure that is based on a trench network etched from a top face of a substrate to form an array of separated pillars. The 3D-capacitor structure includes a double capacitor layer stack that extends continuously on top faces of the pillars at the substrate top face, on trench sidewalls and also on a trench bottom. The trench network is modified locally for contacting a second electrode of the double capacitor layer stack while ensuring that no unwanted short-circuit may occur between the second electrode and a third electrode of the double capacitor layer stack. The 3D-capacitor structure provides an improved trade-off between high capacitor density and certainty of no unwanted short-circuit.

16 Claims, 3 Drawing Sheets

3D-CAPACITOR STRUCTURE

CROSS-REFERENCE TO RELATED APPLICATIONS

The present application is a continuation of PCT/EP2017/073451 filed Sep. 18, 2017, which claims priority to European Patent Application No. 16306200.3, filed Sep. 20, 2016, the entire contents of each of which are incorporated herein by reference.

TECHNICAL FIELD

The present disclosure relates to a 3D-capacitor structure, standing for three-dimensional capacitor structure, an electrical device which comprises such 3D-capacitor structure and a manufacturing process thereof.

BACKGROUND OF THE INVENTION

In general, capacitor structures with very high capacitor density have become an issue for applications such as power source decoupling. For such decoupling applications, surface-mounted capacitors are commonly implemented at the printed board level. These capacitors are connected to the power source in parallel with an electronic circuit which is power-fed by the power source. However, significantly long electrical connections are necessary in such implementations between the surface-mounted capacitors and the power source, and also to the circuit, and these connections produce significant equivalent serial inductance. These implementations are therefore inappropriate for efficient decoupling when high rejection is desired.

Silicon-embedded capacitor structures are technology alternative to the surface-mounted capacitors, and they do not require long electrical connections. Then the equivalent serial inductance is no longer an issue for power source decoupling applications, but the silicon-embedded capacitor structures exhibit high equivalent serial resistance, especially for 3D-capacitor structures. Indeed, the 3D-capacitor structures implement electrode layers which are deposited within trenches, and which then have features including: (1) the electrode design within the trenches leads to flow distances for the electrical charges in the electrodes which are quite long; (2) the electrode layers are thin for avoiding clogging of the trenches during deposition of each electrode layer; and (3) the deposition processes that are implemented for in-trench deposition of the electrodes are limited to electrode materials which do not have very high values for electrical conductivity.

These features contribute to increase the equivalent serial resistance. They are especially critical for the second electrode, also called intermediate electrode when a double capacitor layer stack is used inside and between the trenches. Indeed, although producing higher values for the capacitor density, double capacitor layer stacks lead simultaneously to higher values for the equivalent serial resistance, in particular due to the small thickness and limited conductivity of the layer which forms the second electrode.

Starting from this situation for 3D-capacitor structures based on double capacitor layer stacks, it has been implemented arranging a metal wiring network in parallel with the second electrode, and providing electrical contacts from this wiring network to the second electrode according to a distributed design, so as to avoid long-distance flow for the electrical charges within the second electrode. However, providing a plurality of electrical contacts to the second electrode of a 3D-capacitor structure based on a double capacitor layer stack may be a difficult issue. It requires removing the third electrode layer at the locations of the contact areas. But because the double capacitor layer stack conforms to the trench design, short-circuits between the second and the third electrodes may occur near the top edges of the trenches. For avoiding such short-circuits, the electrical contacts to the second electrode layer may be located in circuit parts which are devoid of trenches. The layout of the capacitor structure in these circuit parts is then no longer three-dimensional, i.e. it is comprised of electrode layers which are parallel to the top face of the circuit substrate. It is then easy to remove the third electrode within these circuit parts and produce electrical contacts to the second electrode, while ensuring that no short-circuit between the second and the third electrodes occur.

However, providing circuit parts where the electrode layers are parallel to the substrate top face leads to decrease the capacitor density as compared to 3D-capacitor structures.

SUMMARY OF THE INVENTION

In view of this last situation described above, one object of the present disclosure is to provide a new 3D-capacitor structures with improved trade-off between high value for the capacitor density and certainty that no short-circuit may occur between the second and the third electrodes of a double capacitor layer stack.

For meeting this object or others, a first exemplary aspect of the present disclosure provides a 3D-capacitor structure that includes a substrate; a trench network extending from a top face of the substrate down to a trench bottom along a depth direction which is perpendicular to the substrate top face, with the trench network forming a regular array of separated pillars which are located apart from each other and each surrounded by a closed-loop trench pattern parallel to the substrate top face; a double capacitor layer stack extending continuously as one single piece on top faces of the pillars at the substrate top face, on trench sidewalls which are parallel to the depth direction, and also on the trench bottom, this double capacitor layer stack comprising from the substrate: a first electrode, a first insulating layer, a second electrode, a second insulating layer and a third electrode; and at least one contact pad which is located above the substrate top face along the depth direction, and arranged for contacting electrically the second electrode.

As a result, the exemplary aspect provides a 3D-capacitor structure that includes a double capacitor layer stack, also called double-MIM stack standing for double metal-insulator-metal stack. Therefore, the capacitor density of the exemplary capacitor structure may be high. In addition, the substrate-embedded configuration allows low value for the equivalent serial inductance, as compared to discrete surface-mounted capacitors.

According to a first exemplary feature of the invention, denoted /i/, the trench network is different about at least one of the pillars, referred to as a "contact-supporting pillar", with respect to the regular array of separated pillars by providing additional substrate portions for bridging between neighboring pillars which are next to the contact-supporting pillar. Then, the additional substrate portions together with the neighboring pillars form a closed-loop trench separation which surrounds the contact-supporting pillar and has a flat top contained in the substrate top face.

According to a second exemplary feature of the invention, denoted /ii/, the first electrode, the first insulating layer and the second electrode extend continuously across the flat top of the closed-loop trench separation and within a separated closed-loop trench portion which is located between the contact-supporting pillar and the closed-loop trench separation, and also within other trench portions which are located outside the closed-loop trench separation.

According to a third exemplary feature of the invention, denoted /iii/, the flat top of the closed-loop trench separation is devoid of the third electrode at least along a closed-loop strip which is contained in this flat top and surrounds the separated closed-loop trench portion and the contact-supporting pillar. In this way, a portion of the third electrode which is contained within the separated closed-loop trench portion is isolated from another portion of the third electrode which is outside the closed-loop strip.

Finally, according to a fourth exemplary feature of the invention, denoted /iv/, the contact pad is in electrical contact with the second electrode at least above part of the contact-supporting pillar.

Because the closed-loop strip is located on the flat top of the closed-loop trench separation, it can ensure electrical insulation between both portions of the third electrode thus separated from each other, and lying inside and outside the closed-loop strip respectively. The closed-loop strip can be produced by implementing simple and well-controlled processes, such as etching or masking processes. The insulation effectiveness of the closed-loop strip and its production easiness are due to the fact that the closed-loop trench separation suppresses any discontinuity in the surface which contains the closed-loop strip.

Then, if the contact pad dedicated for contacting the second electrode accidentally also contacts the third electrode, for example at a top edge of the separated closed-loop trench portion, this has no detrimental effect since the closed-loop strip ensures isolation between the portion of the third electrode which is inside this closed-loop strip and the remainder of the third electrode outside the closed-loop strip.

According to an exemplary aspect, the part of the third electrode that is inside the closed-loop strip is no longer effective for the capacitor density, but this relates to a limited part of the whole 3D-capacitor structure. However, the capacitor contribution which is provided by the first and second electrodes inside the closed-loop strip is still effective. So the loss in capacitor density which is caused by the requirement of contacting the second electrode is limited, even if a plurality of such contacts is provided to maintain a low value for the equivalent serial resistance. In this way, the exemplary embodiment can provide an optimized trade-off between high value for the capacitor density and low value for the equivalent serial resistance. A 3D-capacitor structure according to the invention is thus well-adapted for achieving efficient power source decoupling.

In general, the top face of the contact-supporting pillar may also be devoid of the third electrode at least within a contact area of the contact pad with the second electrode, and further devoid of second insulating layer at least within this contact area.

Preferably, the 3D-capacitor structure may be devoid of any portion of the third electrode which extends parallel to the substrate top face, inside the closed-loop strip, including part of the top face of the contact-supporting pillar and above the separated closed-loop trench portion which is located between this contact-supporting pillar and the closed-loop trench separation.

In preferred implementations of the exemplary embodiment, the 3D-capacitor structure may further comprise a top layer of an electrically insulating material which is arranged on the double capacitor layer stack. This top layer then has an aperture which is located inside an outer limit of the closed-loop strip and apart from this outer limit of the closed-loop strip. Then, the contact pad may be in contact with the second electrode through the aperture of the top layer.

Generally, the substrate may be a semiconductor substrate, in particular a silicon substrate. So, the 3D-capacitor structure may be substrate-embedded, as opposed to surface-mounted capacitors and capacitors which would be located in metallization layers stacked above the substrate top face. In such case of substrate-embedded 3D-capacitor structure, the first electrode may be comprised of an electrically conducting portion of the substrate, which extends along the substrate top face, the trench sidewalls and the trench bottom. Alternatively, the first electrode may comprise a layer of an electrically conducting material, which covers the substrate top face, the trench sidewalls and the trench bottom.

Features /i/ to /iv/ are preferably met for a plurality of contact-supporting pillars that are distributed apart from each other across the substrate top face. Thus, each contact-supporting pillar is provided with one closed-loop trench separation which surrounds this contact-supporting pillar, and with one contact pad which is in electrical contact with the second electrode above the same contact-supporting pillar, within one separate closed-loop strip, independently from any other contact-supporting pillar. Then, the 3D-capacitor structure may further comprise a set of electrically conducting tracks which are located above the substrate top face, and arranged for connecting all of the contact pads in an electrical parallel arrangement. In this way, the electrically conducting tracks provide conduction paths in parallel to the second electrode, so as to decrease the value of the equivalent serial resistance.

According to a second exemplary aspect of the present disclosure, an electrical device is provided that includes an electrical power source and an electronic circuit, both connected so that the circuit is power-fed by the power source. According to the exemplary aspect, the device further comprises a 3D-capacitor structure which is in accordance with the first invention aspect, and connected electrically in parallel with the circuit from the power source. The 3D-capacitor structure produces an efficient decoupling function for the circuit with respect to the power source.

Preferably, the circuit may be integrated within a die and the substrate of the 3D-capacitor structure is preferably arranged close against the die. Such arrangement further ensures low value for the equivalent serial inductance.

Finally, a third exemplary aspect of the present disclosure provides a method for manufacturing a 3D-capacitor structure, that includes the steps of: /1/ providing a substrate having a top face and a depth direction which is perpendicular to the top face; /2/ etching a trench network from the substrate top face down to a trench bottom along the depth direction, the trench network forming a regular array of separated pillars which are located apart from each other and each surrounded by a closed-loop trench pattern parallel to the substrate top face; /3/ depositing a double capacitor layer stack on the substrate, so that this double capacitor layer stack extends continuously as one single piece on top faces of the pillars at the substrate top face, on trench sidewalls which are parallel to the depth direction, and also on the trench bottom, the double capacitor layer stack comprising from the substrate: a first electrode, a first insulating layer, a second electrode, a second insulating layer and a third electrode; and /7/ forming at least one contact pad above the substrate top face along the depth direction, this contact pad being arranged for contacting electrically the second electrode.

According to an exemplary aspect, the trench network is modified in step /2/ about at least one of the pillars, called contact-supporting pillar, with respect to the regular array of separated pillars by leaving additional substrate portions for bridging between neighboring pillars which are next to the contact-supporting pillar. In this way, the additional substrate portions together with the neighboring pillars form the closed-loop trench separation which surrounds the contact-supporting pillar and has the flat top contained in the substrate top face.

Additionally, the process further comprises, between steps /3/ and /7/, a step /4/ of removing the third electrode at least along a closed-loop strip which is contained in the flat top of the closed-loop trench separation and surrounds the contact-supporting pillar, and also surrounds a separated closed-loop trench portion which is located between the contact-supporting pillar and the closed-loop trench separation. Thus, a portion of the third electrode contained within the separated closed-loop trench portion is isolated from another portion of the third electrode which is outside the closed-loop strip, while leaving the first electrode, the first insulating layer and the second electrode continuous on the flat top, within the separated closed-loop trench portion, and above the contact-supporting pillar.

Also in step /7/, the contact pad is formed so as to be in electrical contact with the second electrode at least above part of the contact-supporting pillar.

In preferred exemplary aspects of the disclosed method, the third electrode may be removed in step /4/ simultaneously along the closed-loop strip and also within a contact area of the contact pad with the second electrode. This contact area then extends at least above part of the contact-supporting pillar. The second insulating layer is also removed at least within the contact area.

Possibly, any portion of the third electrode which extends parallel to the substrate top face may be removed in step /4/ inside the closed-loop strip, including above part of the contact-supporting pillar and above the separated closed-loop trench portion which is located between this contact-supporting pillar and the closed-loop trench separation.

The invention process may further comprise the following steps performed between step /4/ and step /7/, including /5/ depositing a top layer of an electrically insulating material on the double capacitor layer stack; then /6/ etching an aperture through this top layer, so that the aperture is located inside an outer limit of the closed-loop strip and apart from this outer limit of the closed-loop strip.

Then, the contact pad can be formed in step /7/ so as to contact the second electrode through the aperture of the top layer.

Finally, for reducing the equivalent serial resistance which is due to the second electrode, a plurality of contact-supporting pillars may be provided simultaneously apart from each other across the substrate top face, so that each contact-supporting pillar is combined with one closed-loop trench separation which surrounds this contact-supporting pillar, and with one contact pad which is in electrical contact with the second electrode above the same contact-supporting pillar, within one separate closed-loop strip, independently from any other contact-supporting pillar. Then, the process may further comprise the following step performed after step /7/, including step /8/ of forming a set of electrically conducting tracks which are located above the substrate top face and arranged for connecting all the contact pads in an electrical parallel arrangement.

BRIEF DESCRIPTION OF THE DRAWINGS

It is noted that for clarity sake, element sizes which appear in these figures do not correspond to actual dimensions or dimension ratios. Also, same reference numbers or signs which are indicated in different ones of these figures denote identical elements of elements with identical function.

DETAILED DESCRIPTION

Figure 1:
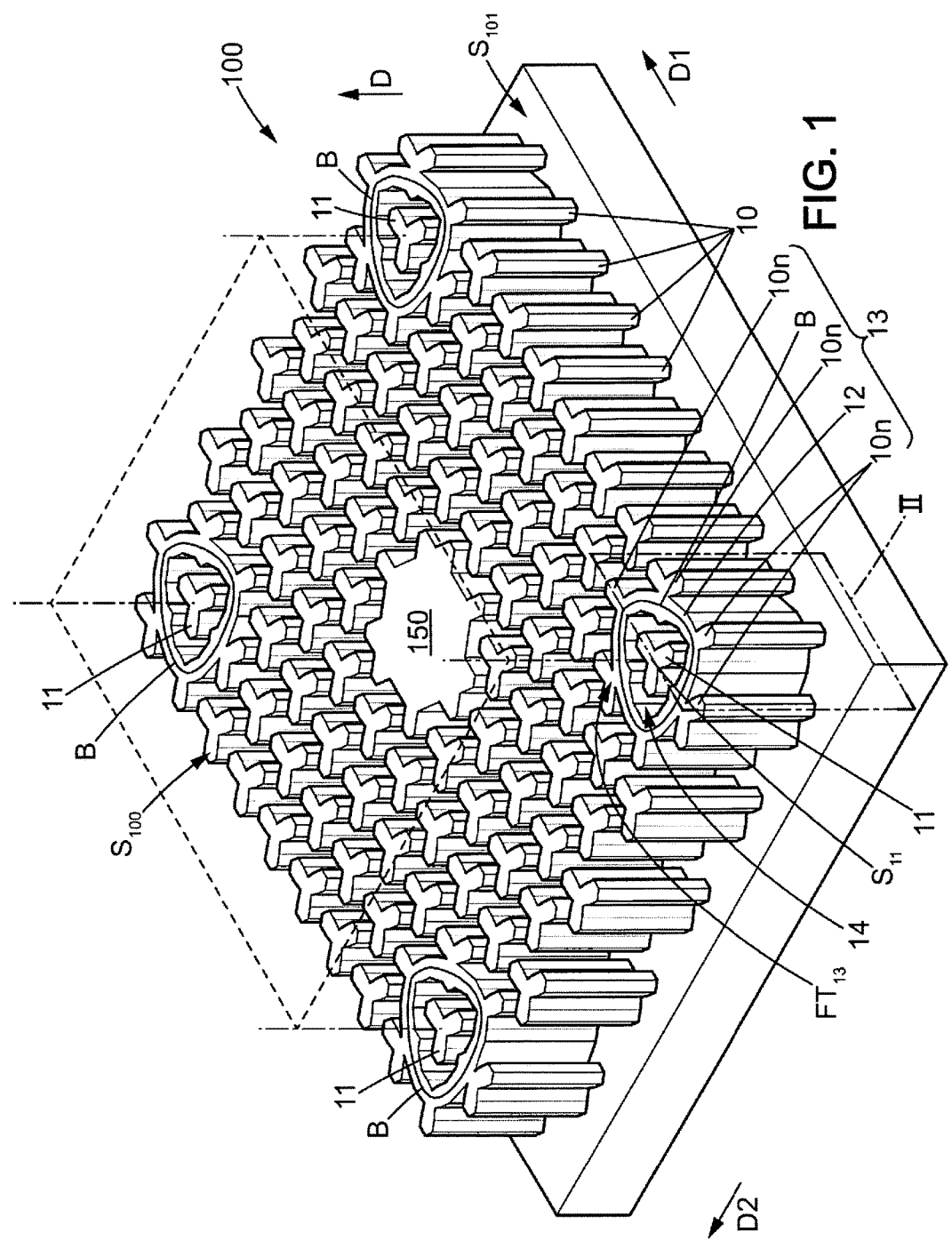
FIG. 1 is a perspective view of a substrate used for a 3D-capacitor structure in accordance with an exemplary aspect.
Figure 1A:
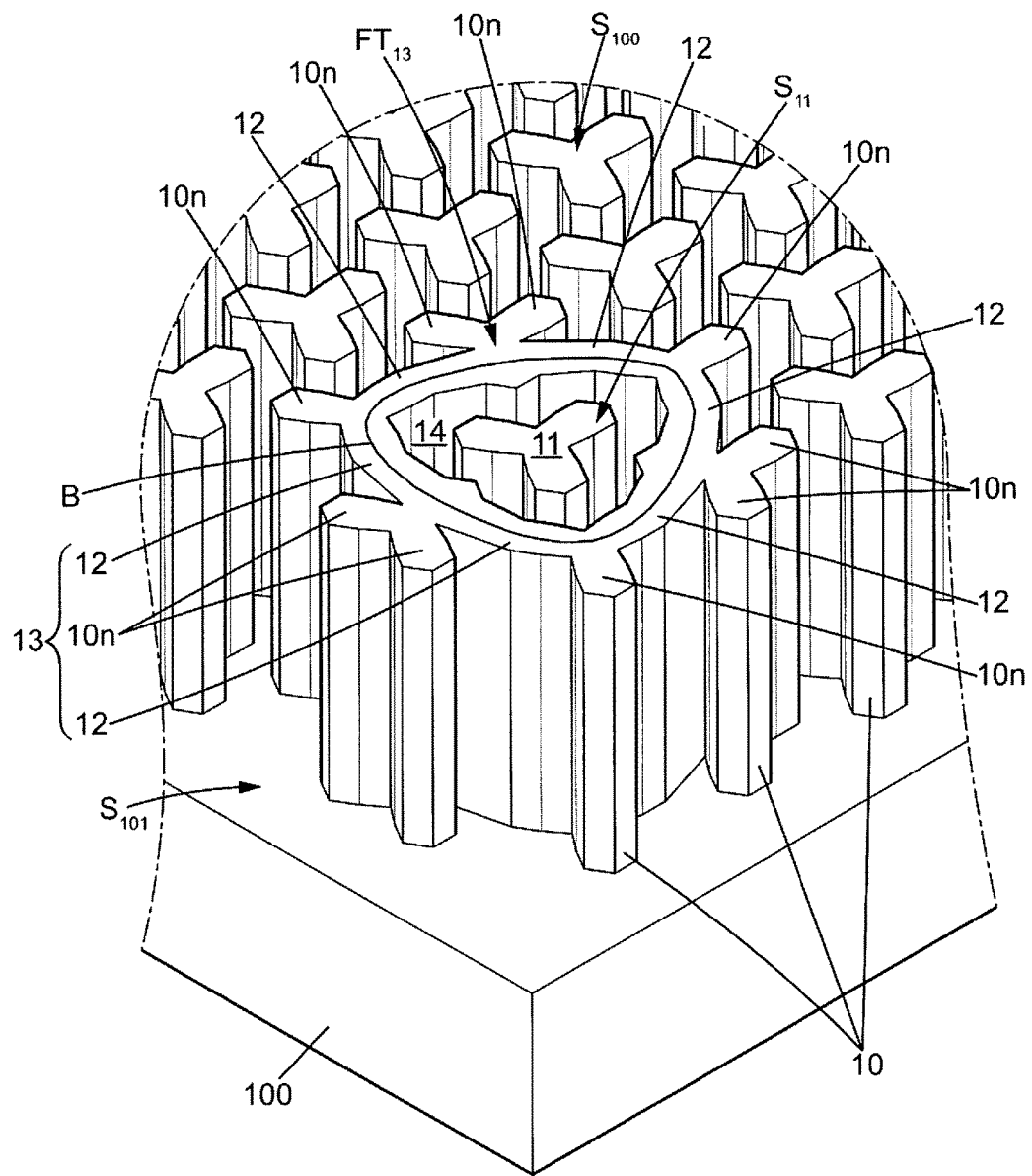
FIG. 1A is an enlargement of part of FIG. 1.

As shown in FIGS. 1 and 1A, a semiconductor substrate 100 has a top face denoted $S_{100}$ and a depth direction D which is perpendicular to the top face $S_{100}$. The substrate 100 may be a silicon substrate. It is etched from its top face $S_{100}$ down to a trench bottom level $S_{101}$, parallel to the depth direction D, outside separate masked areas which are distributed across the substrate top face $S_{100}$. The masked areas are distributed according to a regular two-dimensional array, which may have a triangular, square, rectangular, hexagonal base pattern or the like. In this way, a regular two-dimensional array of separate pillars 10 is obtained on the substrate 100, which corresponds to the array of the masked areas. A trench network extends between all the pillars 10, laterally across the substrate 100 along directions parallel to the substrate top face $S_{100}$ and denoted D1 and D2, and also between the substrate top face $S_{100}$ and the trench bottom $S_{101}$ along the depth direction D. Any masking and etching process may be implemented for forming the trench network, for example a chemical etching process. Generally, the pillar cross-sectional shape may be any, parallel to the top face $S_{100}$, but it is advantageously selected for providing mechanical strength to the structure, in particular against crushing parallel to the depth direction D. In the exemplary embodiment of FIG. 1, each pillar 10 has individually a three-point star shape in cross-section, and the pillar array has a centred hexagonal pattern.

According to an exemplary aspect, the regular pillar array is modified about at least one of the pillars, for isolating a closed-loop trench portion which surrounds this pillar from the remainder of the trench network. The pillar of concern has been called contact-supporting pillar in the general part of the description and is indicated with reference number 11 in FIGS. 1 and 1A. To this end, several pillars which are neighbouring the pillar 11, and are indicated with reference number 10n, are joined together with additional substrate portions 12 so as to form a closed-loop trench separation 13 about the pillar 11. Advantageously, the additional substrate portions 12 have been provided by arranging additional mask portions at the same time as those mask portions which are dedicated to the pillars 10, before the trench etching step. The closed-loop trench portion which is thus separated from the remainder of the trench network by the closed-loop trench separation 13 is indicated with reference number 14. In this manner, the following pattern is formed, when moving from the pillar 11 radially: the pillar 11 is surrounded by the separated closed-loop trench portion 14, which is surrounded in turn by the closed-loop trench separation 13, and then the pillar array extends with its regular pattern. Reference signs $S_{11}$ and $FT_{13}$ denote the top face of the contact-supporting pillar 11 and the flat top of the closed-loop trench separation 13, respectively, which both lie within the substrate top face $S_{100}$.

Preferably, such modification of the pillar array and trench network which comprises the pillar 11, the closed-loop trench separation 13 and the separated closed-loop trench portion 14, may be repeated at several locations across the substrate surface which are apart from each other. Advantageously, these locations of contact-supporting pillars may be distributed across the substrate top face $S_{100}$ so as to form a pillar sub-array, for example with square base pattern. In FIG. 1, one pillar out of nine is thus made contact-supporting pillar along direction D1, and one pillar out of five is made contact-supporting pillar along direction D2.

In one exemplary aspect, a zone 150 in the substrate top face $S_{100}$ may be devoid of trenches. Such zone may be produced again by adapting the mask used for limiting the trench etching areas, by arranging a continuous mask area which matches the shape desired for the zone 150. The zone 150 may also be repeated across the substrate top face $S_{100}$, for example at the center of each base pattern of the contact-supporting pillar sub-array.

Figure 2:
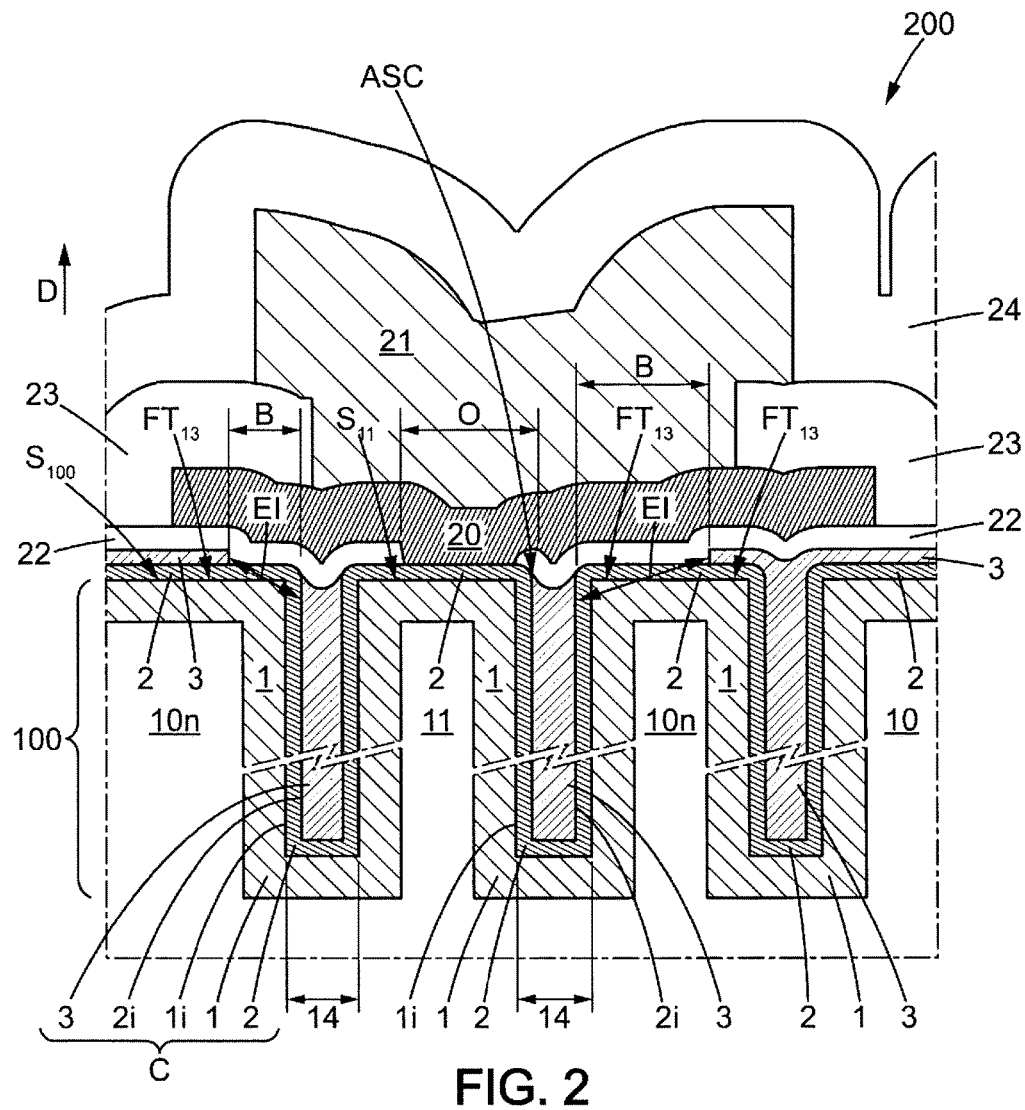
FIG. 2 is a cross-sectional view drawn from plane II as indicated in FIG. 1, of a 3D-capacitor structure in accordance with the exemplary aspect that is produced from the substrate of FIG. 1.

Then a double capacitor layer stack C is formed in the trench network and on the pillar structure just described, as shown in FIG. 2. To this end, the following material layers may be formed or deposited so as to extend each continuously on the pillars 10, including on the top faces $S_{11}$ of the contact-supporting pillars 11 and on the flat tops $FT_{13}$ of the closed-loop trench separations 13, on the trench sidewalls parallel to the depth direction D and on the trench bottom $S_{101}$, including the separated closed-loop trench portions 14, and also on the optional zone 150. The double capacitor layer stack C comprises the following layers which are stacked on one another in the following order from the substrate 100: a first electrode 1, a first insulating layer 1*i*, a second electrode 2, a second insulating layer 2*i* and a third electrode 3. Two embodiments are possible as variants for the first electrode 1: either a reinforced doping layer created within the substrate 100 along the top faces $S_{11}$, the flat tops $FT_{13}$, the top faces of the pillars 10, the trench sidewalls and the trench bottom $S_{101}$, or a layer of an electrically conducting material deposited on the same surfaces of the substrate 100. The electrically conducting material deposited for the first electrode 1 may be a refractory metal such as tungsten (W) or tantalum (Ta), for example. The first insulating layer 1*i* may be an oxidation layer of the material of the first electrode 1, or a silica ($SiO_2$) or titanium oxide ($TiO_2$) layer, or a multi-dielectric layer in a known manner. The second electrode 2 may be a refractory metal layer too, and the second insulating layer 2*i* may be identical to the first insulating layer 1*i*. The third electrode 3 may be a polysilicon layer. Possibly, the third electrode 3 may fill the trenches, or an additional filling material may be deposited for trench infill after the material of the third electrode 3. The material layers of the double capacitor layer stack C may be deposited using low pressure processes such as chemical vapor deposition or atomic layer deposition.

The zone 150 may be dedicated to arranging electrical contacts to the first electrode 1 and/or the third electrode 3, but this is not directly connected to the invention. Indeed, one main issue of the invention is contacting electrically the second electrode 2 in a reliable manner, as now explained.

Contacting the second electrode 2 of the double capacitor layer stack C from above the substrate top face $S_{100}$ requires removing the third electrode 3 and the second insulating layer 2*i* so as to expose the second electrode 2. However, if such contact to the second electrode 2 were produced in a zone of the regular pillar array, this would lead to expose also top parts of the third electrode 3 as contained in the trenches, very close to a contact pad arranged for contacting the second electrode 2. Such contact pad for contacting the second electrode 2 would even overlap trench portions where the top parts of the third electrode 3 are flush with the top face $S_{11}$ of the contact-supporting pillar 11 and with the flat top $FT_{13}$ of the closed-loop trench separation 13. This would result in possible accidental short-circuits occurring between the second electrode 2 and the third electrode 3 through the contact pads used for contacting the second electrode 2, which are not desired. Such short-circuits may appear because the pillars 10 are smaller than or have similar dimensions in cross-section as the contact pad, and increasing the cross-sectional dimensions of the pillars 10 is unfavorable to capacitor density value.

For addressing this issue, the contact pads that are dedicated for contacting the second electrode 2 are located above the pillars 11, referred to as "contact-supporting pillars" for this reason. In addition, according to another one of the invention features, the third electrode 3 is removed along a closed-loop strip B (see FIGS. 1, 1A and 2) in the flat top $FT_{13}$ of the closed-loop trench separation 13. Such closed-loop strip B can be entirely located within the flat top $FT_{13}$ since the trench separation 13 has a closed-loop design. In addition, the strip B lies apart from the separated closed-loop trench portion 14 which is surrounded by the closed-loop trench separation 13. Then, any remaining portion of the third electrode 3 within the area surrounded by the closed-loop strip B is no longer in electrical contact with the remainder of the third electrode 3 outside the closed-loop strip B. This applies in particular to the portion of the third electrode 3 which is contained in the separated closed-loop trench portion 14, and which may be accidentally in contact with the contact pad dedicated to the second electrode 2. The location of such accidental short-circuit is indicated by the reference ASC in FIG. 2.

Preferably, the closed-loop strip B extends inwardly at least to the peripheral sidewall of the separated closed-loop trench portion 14. The double arrows with reference EI in FIG. 2 indicate the electrical insulation distance which is thus produced between the part of the third electrode 3 which is located within the separated closed-loop trench portion 14 and the remainder of the third electrode 3 which is located radially outside the closed-loop strip B. This electrical insulation distance EI inhibits any electrical short-circuit effect of an accidental contact between the portion of the third electrode 3 contained in the separated closed-loop trench portion 14 and the pad dedicated for contacting the second electrode 2 (see location indicated with the reference ASC in FIG. 2).

Most preferably, the third electrode 3 is removed across the whole area which is contained within the closed-loop strip B, including within a part of the flat top $FT_{13}$ of the closed-loop trench separation 13 internal to the strip B, but also including the top face $S_{11}$ of the contact support pillar 11, and also possibly including a zone above the separated closed-loop trench portion 14, maybe in an insufficiently controlled manner in this latter zone but without electrical effect as already explained.

The electrical contact to the second electrode 2 from above the substrate top face $S_{100}$ can then be produced in a usual manner. A top layer of insulating material 22 is deposited at first on the capacitor structure C. This top layer 22 may be silica deposited using a LPCVD process, standing for low-pressure chemical vapor deposition process. An aperture O is provided in the top layer 22 so as to expose the second insulating layer 2i. This latter is then removed in the aperture O, and the second electrode 2 is thus exposed through the aperture O.

First and second metallization levels, commonly called Metal1 and Metal2, are produced thereafter in a manner well-known in the art.

The first metallization level comprises a contact pad 20 which is in electrical contact with the second electrode 2 through the aperture O, and an insulating material layer 23. The contact pad 20 may be out of aluminum (Al), deposited using processes such as evaporation, sputtering or CVD processes. The aperture O thus limits the contact area between the contact pad 20 and the second electrode 2. Possibly, this contact area may extend to the separated closed-loop trench portion 14, where the top parts of the third electrode 3 are flush with the top face $S_{100}$. But an accidental contact which would occur at this location, as denoted by the arrow ASC in FIG. 2, has no electrical effect out of the closed-loop strip B thanks to the electrical insulation EI. The layer 23 may be a silica layer deposited using a PECVD process, standing for plasma-enhanced chemical vapor process. Actually, one separate contact pad 20 is formed in this way above each contact-supporting pillar 11.

The second metallization level comprises at least one metal track 21 which is in electrical contact with several contact pads 20, and a protection layer 24. The protection layer 24 may be a silicon nitride ($Si_3N_4$) layer deposited using again a PECVD process. The metal track(s) 21 may be aluminum tracks, possibly obtained using the same process as implemented for the contact pads 20 in the first metallization layer. The metal track(s) 21 connects (connect) several or all the contact pads 20 so as to form a set of multiple electrical contacts to the second electrode 2, which are distributed across the whole double capacitor layer stack C and connected in parallel. In this way, a contribution of the second electrode 2 to the equivalent serial resistance of the capacitor structure C is reduced.

It appears from the manufacturing process just described that a capacitor unit which is formed by the third electrode 3 facing the second electrode 2 through the second insulating layer 2i, within the double capacitor layer stack C, is suppressed locally within the closed-loop strip B. However, the other capacitor unit existing within the double capacitor layer stack C, which is formed by the second electrode 2 facing the first electrode 1 through the first insulating layer 1i, extends continuously below each electrical contact to the second electrode 2. In particular this latter capacitor unit extends continuously across the flat top $FT_{13}$ of each closed-loop trench separation 13, within each separated closed-loop trench portion 14, and across the top face $S_{11}$ of each contact-supporting pillar 11. It participates in this way in obtaining a high value for the capacitor density.

Figure 3:
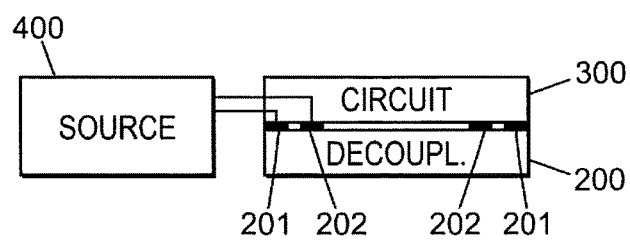
FIG. 3 illustrates an electrical device in accordance with an exemplary aspect.

The 3D-capacitor structure thus obtained is denoted with reference number 200. It may be used as a decoupling capacitor within an electrical device as shown in FIG. 3. It comprises a useful electronic circuit 300, noted "CIRCUIT", which is powered by an external power source 400. In particular, at least part of the circuit 300 may be integrated within a die. Then, the 3D-capacitor structure 200 is connected in parallel with the circuit 300, in a manner effective electrically from the power source 400. Advantageously, the substrate 100 of the 3D-capacitor structure 200 may be arranged close to the die of the circuit 300, with electrical connections 201 and 202 which may be arranged between the die of the circuit 300 and the 3D-capacitor structure 200. Connection designs may be implemented preferably for the connections 201 and 202 in which the connection lengths are short and the connection areas are wide. They are represented as intermediate surface pads in FIG. 3, but other connection designs such as solder bumps may be used alternatively. In this way, the 3D-capacitor structure 200 provides an efficient decoupling function, noted "DECOUPL", as shown in FIG. 3. Such decoupling efficiency may be advantageous especially when the power source 400 is common to several useful circuits to be power-fed in parallel. It is also advantageous when the power consumption of the useful circuit 300 exhibits power bursts.

The exemplary aspects of the invention may also be applied for capacitor layer stacks that comprise more than three electrodes stacked on one another, for example four electrodes corresponding to a triple capacitor layer stack. Then, additional closed-loop trench separations may be provided around each contact-supporting pillar, in a concentric arrangement. One such additional closed-loop trench separation may be dedicated to avoid accidental short-circuit to each additional intermediate electrode of the capacitor layer stack beyond the case of the double capacitor layer stack. One separate electrical contact to each intermediate electrode can thus be arranged, at the flat tops of inner closed-loop trench separations in addition to the contact-supporting pillar.

What is claimed:

1. A 3D-capacitor structure comprising:
 a substrate;
 a trench network that extends from a top face of the substrate down to a trench bottom along a depth direction that is perpendicular to the top face of the substrate, the trench network forming an array of separated pillars that are located apart from each other and are each surrounded by a closed-loop trench pattern parallel to the top face of the substrate;
 a double capacitor layer stack that extends continuously as one single piece on respective top faces of the pillars at the top face of the substrate, on trench sidewalls that are parallel to the depth direction, and on the trench bottom, the double capacitor layer stack including a first electrode, a first insulating layer, a second electrode, a second insulating layer and a third electrode; and
 at least one contact pad disposed above the top face of the substrate along the depth direction and configured to electrically contact the second electrode,
 wherein at least one pillar of the array of separated pillars forms a contact-supporting pillar by providing additional substrate portions that bridge between neighboring pillars adjacent to the contact-supporting pillar, such that the additional substrate portions together with the neighboring pillars form a closed-loop trench separation that surrounds the contact-supporting pillar and has a flat top contained in the top face of the substrate;
 wherein the first electrode, the first insulating layer and the second electrode extend continuously across the flat top of the closed-loop trench separation and within both a separated closed-loop trench portion located between the contact-supporting pillar and the closed-loop trench separation and other trench portions located outside said closed-loop trench separation;

wherein the flat top of the closed-loop trench separation is devoid of the third electrode at least along a closed-loop strip that is contained in said flat top and surrounds the separated closed-loop trench portion and the contact-supporting pillar, such that a portion of the third electrode contained within the separated closed-loop trench portion is isolated from another portion of the third electrode that is outside the closed-loop strip; and wherein the contact pad is in electrical contact with the second electrode at least above part of the contact-supporting pillar.

2. The 3D-capacitor structure according to claim 1, wherein the top face of the contact-supporting pillar is devoid of both the third electrode at least within a contact area of the contact pad with the second electrode the second insulating layer at least within said contact area.

3. The 3D-capacitor structure according to claim 1, wherein the top face of the contact-supporting pillar is devoid of any portion of the third electrode that extends parallel to the top face of the substrate, inside the closed-loop strip, including part of the top face of the contact-supporting pillar and above the separated closed-loop trench portion that is located between the contact-supporting pillar and the closed-loop trench separation.

4. The 3D-capacitor structure according to claim 1, further comprising a top layer of an electrically insulating material disposed on the double capacitor layer stack, wherein the top layer has an aperture that is located inside an outer limit of the closed-loop strip and apart from said outer limit of the closed-loop strip, and the contact pad being in contact with the second electrode through the aperture of the top layer.

5. The 3D-capacitor structure according to claim 1, wherein the substrate is a silicon substrate.

6. The 3D-capacitor structure according to claim 5, wherein the first electrode is comprised of an electrically conducting portion of the substrate that extends along the top face of the substrate, the trench sidewalls and the trench bottom.

7. The 3D-capacitor structure according to claim 5, wherein the first electrode comprises a layer of an electrically conducting material that covers the top face of the substrate the trench sidewalls and the trench bottom.

8. The 3D-capacitor structure according to claim 1, wherein a plurality of the separated pillars form contact-supporting pillars that are distributed apart from each other across the top face of the substrate, such that each contact-supporting pillar is provided with one closed-loop trench separation that surrounds the respective contact-supporting pillar, and with one contact pad that is in electrical contact with the second electrode above the respective contact-supporting pillar, within one separate closed-loop strip, independently from any other contact-supporting pillar, respectively, and wherein the 3D-capacitor structure further comprises a set of electrically conducting tracks that are disposed above the top face of the substrate and configured to connect all contact pads in an electrical parallel arrangement.

9. An electrical device comprising:
an electrical power source;
an electronic circuit power-fed by the power source; and
a 3D-capacitor structure according to claim 1,
wherein the 3D-capacitor structure is connected electrically in parallel with the circuit from the power source.

10. The electrical device according to claim 9, wherein the circuit is integrated within a die and the substrate of the 3D-capacitor structure is arranged against the die.

11. A method for manufacturing a 3D-capacitor structure, the method comprising:
providing a substrate having a top face and a depth direction that is perpendicular to the top face;
etching a trench network from the top face of the substrate down to a trench bottom along the depth direction, such that the trench network forms an array of separated pillars that are located apart from each other and that are each surrounded by a closed-loop trench pattern parallel to the top face of the substrate;
depositing a double capacitor layer stack on the substrate, such that the double capacitor layer stack extends continuously as one single piece on respective top faces of the separate pillars at the top face of the substrate, on trench sidewalls that are parallel to the depth direction, and on the trench bottom, with the double capacitor layer stack including from a first electrode, a first insulating layer, a second electrode, a second insulating layer and a third electrode; and
forming at least one contact pad above the top face of the substrate along the depth direction, with the at least one contact pad configured to contact electrically the second electrode,
wherein the etching of the trench network comprises forming at least one of the separated pillars as a contact-supporting pillar by leaving additional substrate portions for bridging between neighboring pillars that are next to the contact-supporting pillar, such that the additional substrate portions together with the neighboring pillars form a closed-loop trench separation that surrounds the contact-supporting pillar and has a flat top contained in the substrate top face;
wherein between depositing the double capacitor layer stack and forming the at least one contact pad, the method further comprises removing the third electrode at least along a closed-loop strip that is contained in the flat top the closed-loop trench separation and surrounds the contact-supporting pillar and that surrounds a separated closed-loop trench portion that is located between the contact-supporting pillar and the closed-loop trench separation, such that a portion of the third electrode contained within the separated closed-loop trench portion is isolated from another portion of the third electrode that is outside the closed-loop strip, while leaving the first electrode, the first insulating layer and the second electrode continuous on the flat top, within the separated closed-loop trench portion, and above the contact-supporting pillar, and
wherein the at least one contact pad is formed to be in electrical contact with the second electrode at least above part of the contact-supporting pillar.

12. The method according to claim 11, further comprising:
removing the third electrode along the closed-loop strip and within a contact area of the contact pad with the second electrode, with the contact area extending at least above the contact-supporting pillar; and
removing the second insulating layer at least within said contact area.

13. The method according to claim 11, further comprising removing any portion of the third electrode that extends parallel to the top face of the substrate and inside the closed-loop strip, including above both part of the contact-supporting pillar and the separated closed-loop trench portion that is located between the contact-supporting pillar and the closed-loop trench separation.

14. The method according to claim 11, further comprising:
- depositing a top layer of an electrically insulating material on the double capacitor layer stack;
- etching an aperture through the top layer, such that the aperture is located inside an outer limit of the closed-loop strip and apart from the outer limit of the closed-loop strip; and
- forming the contact pad to contact the second electrode through the aperture of the top layer.

15. The method according to claim 11, further comprising forming a plurality of the separated pillars as contact-supporting pillars simultaneously apart from each other across the top face of the substrate, such that each contact-supporting pillar is combined with one closed-loop trench separation that surrounds the contact-supporting pillar, and with one contact pad that is in electrical contact with the second electrode above the respective contact-supporting pillar, within one separate closed-loop strip, independently from any other contact-supporting pillar.

16. The method according to claim 15, further comprising forming a set of electrically conducting tracks that are located above the top face of the substrate and are arranged for connecting all of the contact pads in an electrical parallel arrangement.

* * * * *